(12) United States Patent
Scheiper et al.

(10) Patent No.: US 9,048,336 B2
(45) Date of Patent: Jun. 2, 2015

(54) REDUCED THRESHOLD VOLTAGE-WIDTH DEPENDENCY IN TRANSISTORS COMPRISING HIGH-K METAL GATE ELECTRODE STRUCTURES

(75) Inventors: Thilo Scheiper, Dresden (DE); Jan Hoentschel, Dresden (DE); Steven Langdon, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 63 days.

(21) Appl. No.: 13/186,813

(22) Filed: Jul. 20, 2011

(65) Prior Publication Data

US 2012/0049293 A1 Mar. 1, 2012

(30) Foreign Application Priority Data

Aug. 31, 2010 (DE) .......................... 10 2010 040 064

(51) Int. Cl.
| | | |
|---|---|---|
| *H01L 21/336* | (2006.01) | |
| *H01L 21/8238* | (2006.01) | |
| *H01L 21/265* | (2006.01) | |
| *H01L 21/28* | (2006.01) | |
| *H01L 29/10* | (2006.01) | |
| *H01L 21/84* | (2006.01) | |
| *H01L 27/12* | (2006.01) | |
| *H01L 29/51* | (2006.01) | |

(52) U.S. Cl.
CPC .. *H01L 21/823807* (2013.01); *H01L 21/26506* (2013.01); *H01L 21/2822* (2013.01); *H01L 21/84* (2013.01); *H01L 27/1203* (2013.01); *H01L 29/1054* (2013.01); *H01L 29/517* (2013.01)

(58) Field of Classification Search
CPC .................... H01L 21/823807; H01L 29/1054
USPC .................................................. 438/217, 289
See application file for complete search history.

(56) References Cited

U.S. PATENT DOCUMENTS

| | | | | |
|---|---|---|---|---|
| 6,080,629 | A | * | 6/2000 | Gardner et al. ............... 438/301 |
| 6,492,216 | B1 | * | 12/2002 | Yeo et al. ...................... 438/197 |
| 2002/0125502 | A1 | * | 9/2002 | Baba et al. ..................... 257/200 |
| 2004/0256614 | A1 | | 12/2004 | Ouyang et al. .................. 257/20 |
| 2007/0238267 | A1 | * | 10/2007 | Liu et al. ....................... 438/478 |
| 2008/0224218 | A1 | | 9/2008 | Liu et al. ....................... 257/351 |
| 2009/0291540 | A1 | * | 11/2009 | Zhang et al. .................. 438/229 |

(Continued)

FOREIGN PATENT DOCUMENTS

| | | | | |
|---|---|---|---|---|
| DE | 102008063432 A1 | 7/2010 | ............ H01L 21/336 |
| DE | 102009006886 A1 | 8/2010 | .......... H01L 21/8234 |

OTHER PUBLICATIONS

Translation of Official Communication from German Patent Office for German Patent Application No. 10 2010 040 064.5 dated May 5, 2011.

*Primary Examiner* — Andy Huynh
*Assistant Examiner* — Sitaramarao S Yechuri
(74) *Attorney, Agent, or Firm* — Amerson Law Firm, PLLC

(57) ABSTRACT

Performance and/or uniformity of sophisticated transistors may be enhanced by incorporating a carbon species in the active regions of the transistors prior to forming complex high-k metal gate electrode structures. For example, a carbon species may be incorporated by ion implantation into the active region of a P-channel transistor and an N-channel transistor after selectively forming a threshold adjusted semiconductor material for the P-channel transistor, while the active region of the N-channel transistor is still masked.

9 Claims, 6 Drawing Sheets

(56) References Cited

U.S. PATENT DOCUMENTS

2010/0109088 A1* 5/2010 Ng et al. .................. 257/369
2010/0164016 A1 7/2010 Kronholz et al. ............ 257/402
2010/0193881 A1 8/2010 Kronholz et al. ............ 257/402
2010/0213553 A1* 8/2010 Hargrove et al. ............ 257/410

* cited by examiner

REDUCED THRESHOLD VOLTAGE-WIDTH DEPENDENCY IN TRANSISTORS COMPRISING HIGH-K METAL GATE ELECTRODE STRUCTURES

BACKGROUND OF THE INVENTION

1. Field of the Invention

Generally, the present disclosure relates to integrated circuits, and, more particularly, to transistors comprising a high-k metal gate electrode structure formed in an early manufacturing stage.

2. Description of the Related Art

The fabrication of complex integrated circuits requires the provision of a large number of transistors, which represent the dominant circuit elements in complex integrated circuits. For example, several hundred million transistors may be provided in presently available complex integrated circuits, wherein performance of the transistors in the speed critical signal paths substantially determines overall performance of the integrated circuit. Generally, a plurality of process technologies are currently practiced, wherein, for complex circuitry, such as microprocessors, storage chips and the like, CMOS technology is the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, the complementary transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface positioned between highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on, among other things, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

When reducing the channel length of field effect transistors, generally an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high-speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, in some approaches, the inferior controllability of the channel region of the short channel transistors caused by the continuous reduction of the critical dimensions of gate electrode structures has been addressed by an appropriate adaptation of the material composition of the gate dielectric material.

To this end, it has been proposed that, for a physically appropriate thickness of a gate dielectric material, i.e., for a thickness resulting in an acceptable level of gate leakage currents, a desired high capacitive coupling may be achieved by using appropriate material systems, which have a significantly higher dielectric constant compared to the conventionally used silicon dioxide-based materials. For example, dielectric materials including hafnium, zirconium, aluminum and the like may have a significantly higher dielectric constant and are therefore referred to as high-k dielectric materials, which are to be understood as materials having a dielectric constant of 10.0 or higher when measured in accordance with typical measurement techniques. As is well known, the electronic characteristics of the transistors also strongly depend on the work function of the gate electrode material, which in turn influences the band structure of the semiconductor material in the channel regions separated from the gate electrode material by the gate dielectric layer. In well-established polysilicon/silicon dioxide-based gate electrode structures, the corresponding threshold voltage, that is strongly influenced by the gate dielectric material and the adjacent electrode material, is adjusted by appropriately doping the polysilicon material in order to appropriately adjust the work function of the polysilicon material at the interface between the gate dielectric material and the electrode material. Similarly, in gate electrode structures including a high-k gate dielectric material, the work function has to be appropriately adjusted for N-channel transistors and P-channel transistors, respectively, which may require appropriately selected work function adjusting metal species, such as lanthanum for N-channel transistors and aluminum for P-channel transistors and the like. For this reason, corresponding metal-containing conductive materials may be positioned close to the high-k gate dielectric material in order to form an appropriately designed interface that results in the target work function of the gate electrode structure. In some conventional approaches, the work function adjustment is performed at a very late manufacturing stage, i.e., after any high temperature processes, after which a placeholder material of the gate electrode structures, such as polysilicon, is replaced by an appropriate work function adjusting species in combination with an electrode metal, such as aluminum and the like. In this case, however, very complex patterning and deposition process sequences are required in the context of gate electrode structures having critical dimensions of 50 nm and significantly less, which may result in severe variations of the resulting transistor characteristics.

Therefore, other process strategies have been proposed in which the work function adjusting materials may be applied in an early manufacturing stage, i.e., upon forming the gate electrode structures, wherein the metal species may be thermally stabilized and encapsulated in order to obtain the desired work function and thus threshold voltage of the transistors without being unduly influenced by the further processing. It turns out that, for many appropriate metal species and metal-containing electrode materials, an appropriate adaptation of the band gap of the channel semiconductor material may be required, for instance, in the P-channel transistors, in order to appropriately set the work function thereof.

For this reason, frequently a so-called threshold adjusting semiconductor material, for instance in the form of a silicon/germanium mixture, is formed on the active regions of the P-channel transistors prior to forming the gate electrode structures, thereby obtaining the desired offset in the band gap of the channel semiconductor material.

With reference to FIGS. 1a-1d, a conventional process will be described in more detail, when complementary transistors are formed so as to provide a high-k metal gate electrode structure in an early phase of the process.

FIG. 1a schematically illustrates a cross-sectional view of a semiconductor device 100 in which a silicon/germanium material is to be provided in the channel area of one type of transistor on the basis of an epitaxial growth process, while the threshold voltage of the other transistor type is adjusted by appropriately selecting the material system in the associated gate electrode structure. In the manufacturing stage shown, the device 100 comprises a substrate 101 and a silicon-based semiconductor layer 102, wherein the substrate 101 and the semiconductor layer 102 form a bulk configuration or a silicon-on-insulator (SOI) configuration, depending on the desired transistor architecture. For example, for an SOI configuration, a buried insulating layer (not shown) is formed below the semiconductor layer 102 and thus isolates the layer 102 with respect to the substrate 101. The semiconductor layer 102 further comprises isolation structures 102C, such as shallow trench isolations, which laterally delineate semiconductor regions or active regions, two of which, indicated as 102A, 102B, are illustrated in FIG. 1a. In the example shown, the active region 102A corresponds to the semiconductor region of a P-channel transistor, while the active region 102B corresponds to an N-channel transistor. An appropriate mask layer 103, such as a silicon dioxide material, may be formed on the active region 102B in order to act as a deposition mask for the selective epitaxial growth of a silicon/germanium material in the active region 102A. In some illustrative approaches, typically a recess 102R is provided in the region 102A prior to actually depositing the silicon/germanium material.

The semiconductor device 100 as illustrated in FIG. 1a may be formed on the basis of the following processes. The isolation structure 102C may be formed by using sophisticated lithography, etch, deposition and planarization techniques, wherein, prior to or after forming the isolation structure 102C, appropriate well dopant species may be incorporated into the active regions 102A, 102B in order to define the basic transistor characteristics. To this end, any well-established implantation techniques and masking regimes may be applied. Thereafter, the mask 103 is formed, for instance, by oxidation, deposition and the like, wherein a non-desired portion of the mask material is removed from above the active region 102A, for instance by applying a resist mask and performing any appropriate etch process. Furthermore, as illustrated, the recess 102R may be formed with an appropriate depth so as to obtain a desired surface topography after the deposition of the silicon/germanium material. Next, a selective epitaxial growth process is performed after any cleaning processes and the like in which process parameters are established in such a manner that a significant semiconductor material deposition is substantially restricted to exposed surface areas of the active region 102A, while any pronounced deposition on dielectric surface areas, such as the mask 103 and the isolation structure 102C is suppressed. To this end, well-established chemical vapor deposition (CVD) techniques with process temperatures in the range of 650-750° C. have been developed on the basis of appropriately selected gas flow rates and process pressure, wherein the fraction of germanium in the silicon/germanium mixture may be set on the basis of controlling the corresponding gas flow rates. As previously explained, the resulting electronic characteristics, in particular the resulting threshold voltage, may significantly depend on the thickness of the silicon/germanium material and the material composition thereof, i.e., the germanium fraction contained therein. For example, a thickness of approximately 8-12 nm and a germanium content of up to 25 percent may be used in order to obtain the required threshold voltage.

FIG. 1b schematically illustrates the semiconductor device 100 in a further advanced manufacturing stage. As illustrated, a silicon/germanium mixture or alloy 104 is formed in the active region 102A and thus represents a portion thereof, thereby providing the desired band gap offset, as discussed above. Furthermore, a gate electrode structure 160A of a P-channel transistor 150A is formed on the channel material 104 and may comprise a gate dielectric material 163A and a metal-containing electrode material 162A, followed by a further electrode material 161, such as silicon and the like. Furthermore, the materials 163A, 162A, 161 may be encapsulated by a spacer structure 165, for instance provided in the form of a silicon nitride material and the like, while also a cap layer 164 may be provided, for instance in the form of silicon dioxide, silicon nitride and the like. Similarly, a gate electrode structure 160B of an N-channel transistor 150B may be formed on the active region 102B and may have basically a similar configuration as the gate electrode structure 160A. That is, a gate dielectric material 163B in combination with a metal-containing electrode material 162B and the electrode material 161 may be provided in combination with the spacer structure 165 and a cap layer 164. It should be appreciated that the gate dielectric materials 163A, 163B may have basically the same configuration and may, however, differ in a work function adjusting species that may have been incorporated therein during the previous processing. For example, frequently, appropriate species may be diffused into the gate dielectric material in order to appropriately modify the characteristics thereof in view of achieving a desired overall work function and thus threshold voltage. Moreover, as discussed above, the gate dielectric layers 163A, 163B comprise a high-k dielectric material such as hafnium oxide and the like, possibly in combination with a thin conventional dielectric material, for instance in the form of silicon oxynitride and the like in view of superior interface characteristics. The metal-containing electrode materials 162A, 162B may have substantially the same composition or may differ with respect to a work function adjusting species, depending on the overall process strategy applied for forming the gate electrode structures 160A, 160B.

A typical process flow for forming the semiconductor device 100 as illustrated in FIG. 1b may comprise the following processes. First, the basic material composition of the gate dielectric layers 163A, 163B may be provided, possibly in combination with any work function adjusting metal species and additional cap materials, such as titanium nitride and the like, and any appropriate treatment, such as anneal processes and the like, may be applied in order to adjust the overall characteristics of the gate dielectric materials 163A, 163B. Thereafter, the same or different materials may be deposited for the layers 162A, 162B followed by the deposition of the material 161, for instance in the form of amorphous or polycrystalline silicon. Moreover, any further material, such as the cap material 164, is provided and the resulting layer stack is patterned on the basis of sophisticated lithography and etch techniques. Thereafter, the spacer structure 165 is formed by any appropriate deposition and etch strategy in order to confine, in particular, the sensitive materials 163A, 163B and 162A, 162B.

Consequently, by means of the channel material 104, an appropriate threshold voltage for the transistor 150A could be in principle obtained, wherein, however, significant defects have been observed in the material 104, as indicated by 104A, when the material 104 is provided with a thickness and material composition, as specified above. However, corresponding defects in the channel region of the transistor 150A may result in significant variation of transistor characteristics or may even result in a non-acceptable transistor performance.

FIG. 1c schematically illustrates the semiconductor device 100 in a further advanced manufacturing stage. As shown, the transistor 150A comprises the gate electrode structure 160A, possibly with an additional spacer structure 166, which may include the spacer structure 165 (FIG. 1b). The spacer structure 166 may be used for defining the lateral and vertical dopant profile of drain and source regions 152. Similarly, the transistor 150B comprises the gate electrode structure 160B and corresponding drain and source regions 152, which, however, have an inverse conductivity type compared to the regions 152 of the transistor 150A. The transistors 150A, 150B may be formed on the basis of any appropriate process strategy for providing the spacer structure 166 and the drain and source regions 152.

In sophisticated applications, the final dopant profile in the drain and source regions is substantially defined by the previously performed implantation processes, while any further dopant diffusion upon activating the implanted drain and source dopant species is considered inappropriate, at least in some manufacturing stages of providing the drain and source dopant species. To this end, frequently advanced anneal techniques may be applied, such as flashlight-based anneal processes, in which pulses of light of different wavelengths may be generated in order to deposit a sufficiently high energy in and at the surface of the semiconductor device so as to create required temperatures that allow an efficient activation of the dopants. That is, during the corresponding advanced flashlight-based anneal techniques, high temperatures are generated in a thin surface layer without unduly heating the remaining portion of the substrate. Since the corresponding heat may be generated within short time intervals, an efficient activation of the dopant species, i.e., a positioning of the dopant atoms at lattice sites, may be accomplished without causing undue dopant diffusion, which may typically require longer time intervals. In other cases, laser-based anneal techniques may be applied in which laser pulses of a specific wavelength may be scanned across the device in order to appropriately control the surface temperature and thus the activation conditions of the dopant species. Also in this case, a very efficient activation of dopants may be accomplished, while at the same time the diffusion activity may be adjusted to a very low level. It should be appreciated that, in particular, laser-based anneal techniques may also be combined with conventional anneal processes, which may be performed on the basis of moderately low temperatures so as to initiate superior re-crystallization, also without generating significant dopant diffusion. Consequently, laser-based anneal processes are frequently considered as a preferred anneal technique to be applied in sophisticated semiconductor devices. It turns out, however, that in particular the laser-based anneal process may result in significant variations of the threshold voltage of transistors and in particular of the N-channel transistor 150B. Without intending to restrict the present application to any theory, it is nevertheless believed that, during the laser-based anneal process, a significant modification of the characteristics of the high-k metal gate electrode structure may be induced, in particular in N-channel transistors such as the transistor 150B.

FIG. 1d schematically illustrates a top view of the semiconductor device 100 during a laser-based anneal process 110. As explained above, during the laser anneal process 110, the temperature of a corresponding portion of the device 100 may be locally increased within a thickness of several micrometers, thereby facilitating the migration of dopant species to a next lattice site. During the time interval of elevated temperature acting on the transistors 150A, 150B, and in particular on the gate electrode structures 160A, 160B, it is assumed that a modification may take place in the sensitive materials 163B, 163A, 162B, 162A (FIG. 1c). For example, it is assumed that high-k dielectric materials may have an increased affinity to oxygen, while also a certain degree of oxygen migration may occur during high temperature processes, which may result in a certain degree of oxygen vacancies, according to some non-confirmed theories. During the process 110, oxygen may be incorporated into the gate electrode structures 160A, 160B, preferably from the edges of the active regions 102A, 102B, for instance due to the presence of the isolation region 102C, at areas in which the gate electrode structures 160A, 160B are in contact with the isolation region 102C. Consequently, it is believed that an increased oxygen ingress into the gate electrode structures 160A, 160B may be induced, as indicated by 111, due to the laser-based anneal process 110. Although the reason is still unknown, a corresponding modification may occur in N-channel transistors to a significantly higher degree compared to P-channel transistors. Thus, the characteristics of the gate electrode structure 160B may be locally modified in the transistor 150B and may thus result, for instance, in a significant shift of the threshold voltage locally at corresponding edges of the active region 102B, which may thus also result in a shift of threshold voltage for the entire transistor 150B. Since the corresponding modification of the high-k dielectric material and/or of the corresponding conductive cap material may be locally restricted to the corresponding edge regions, the overall influence on the transistor 150B may be higher for a reduced transistor width, as indicated by 150W, while the corresponding variation in threshold voltage may be less pronounced upon increasing the transistor width 150W. As a consequence, since typically a plurality of different transistor widths may have to be implemented in complex semiconductor devices, a pronounced variation of the threshold voltages may be observed, in particular for N-channel transistors, thereby making the approach of providing the high-k metal gate electrode structures in an early manufacturing stage less attractive in complex semiconductor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which gate electrode structures including a high-k dielectric material may be formed in an early manufacturing stage while at the same time reducing the variability of transistor characteristics, such as the threshold voltage, in particular of N-channel transistors, when performing spike anneal processes, such as laser-based anneal processes and the like. To this end, it has been surprisingly recognized that the incorporation of carbon at and near the surface of an active region prior to forming a complex gate electrode structure may significantly reduce the modification of sensitive materials of the gate electrode structure. The incorporation of the carbon species may be accomplished, according to some illustrative embodiments, on the basis of an implantation process, which may be performed at any appropriate stage prior to forming the gate electrode structures. In some illustrative embodiments disclosed herein, it has also been recognized that, in addition to enhancing performance of N-channel transistors, also performance of P-channel transistors may be increased in which a threshold adjusting semiconductor material has to be implemented, for instance in the form of a silicon/germanium material. Without intending to restrict the present disclosure to any theory, it is assumed that the incorporation of the carbon species into the P-channel transistor may reduce the number of crystal defects in the threshold adjusting semiconductor material, thereby contributing to superior performance of the P-channel transistor, which may thus be observed on the basis of an improved drive current and the like. The incorporation of carbon in the P-channel transistor may be accomplished on the basis of ion implantation, selective epitaxial growth techniques and the like, wherein, in some illustrative embodiments, the incorporation of carbon into the N-channel transistor and the P-channel transistor may be accomplished during the same process.

One illustrative method disclosed herein comprises forming a threshold adjusting semiconductor material on a semiconductor material of a first active region of a first transistor, while masking a second active region of a second transistor. The method further comprises providing a carbon species at least at a surface of the first and second active regions. Furthermore, the method comprises forming a first gate electrode structure on the threshold adjusting semiconductor material of the first active region and forming a second gate electrode structure on the second active region, wherein each of the first and second gate electrode structures comprises a gate insulation layer including a high-k dielectric material. Moreover, the method comprises forming first drain and source regions of the first transistor in the first active region and second drain and source regions of the second transistor in the second active region.

A further illustrative method disclosed herein relates to forming a semiconductor device. The method comprises performing an ion implantation process so as to incorporate carbon into an active region at a surface thereof. The method further comprises forming a gate electrode structure on the active region that comprises the carbon, wherein the gate electrode structure comprises a gate insulation layer that includes a high-k dielectric material. The method additionally comprises incorporating drain and source dopant species into the active region and performing at least one laser-based anneal process.

One illustrative semiconductor device disclosed herein comprises a first active region and a second active region that are formed above a substrate, wherein the first and second active regions have different conductivity types. The semiconductor device further comprises a first gate electrode structure formed on the first active region and a second gate electrode structure formed on the second active region, wherein the first and second gate electrode structures comprise a high-k dielectric material. The semiconductor device further comprises a first channel region positioned in the first active region below and adjacent to the first gate electrode structure and a second channel region positioned in the second active region below and adjacent to the second gate electrode structure, wherein the first channel region comprises a threshold adjusting semiconductor alloy. The semiconductor device additionally comprises a carbon species provided in the first and second channel regions and drain and source regions are formed in the first and second active regions.

BRIEF DESCRIPTION OF THE DRAWINGS

The disclosure may be understood by reference to the following description taken in conjunction with the accompanying drawings, in which like reference numerals identify like elements, and in which.

Figure 1A:
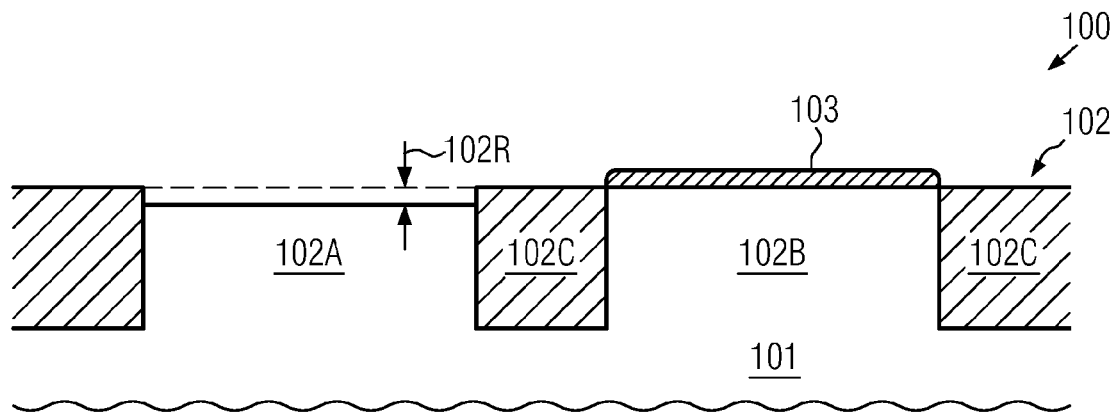
FIGS. 1a-1c schematically illustrate cross-sectional views of a sophisticated semiconductor device in which the threshold voltage of high-k metal gate electrode structures may be adjusted in an early manufacturing stage, for instance by using a silicon/germanium material.
Figure 1B:
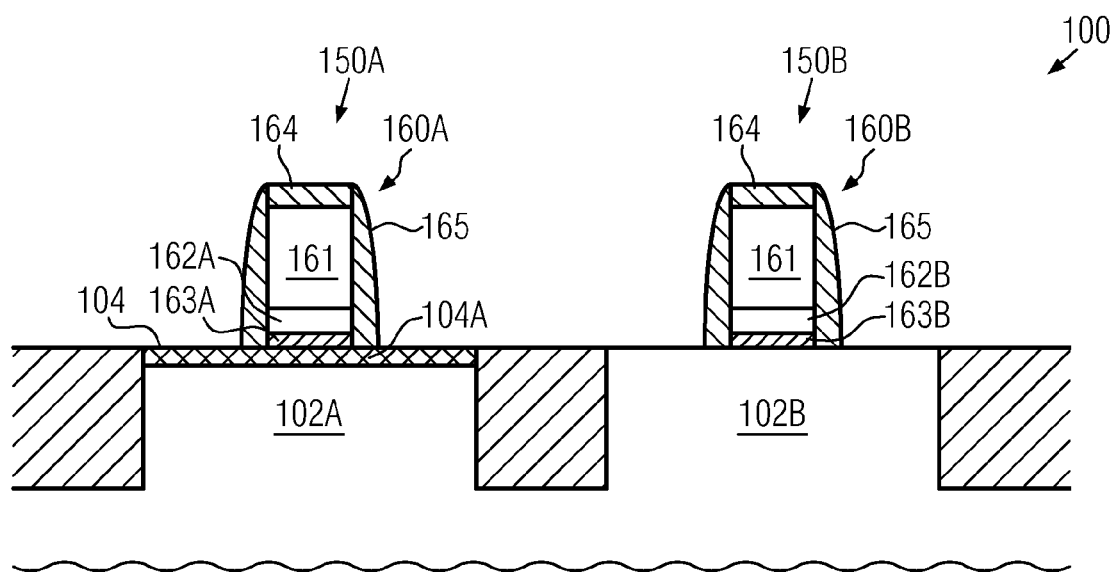
Figure 1C:
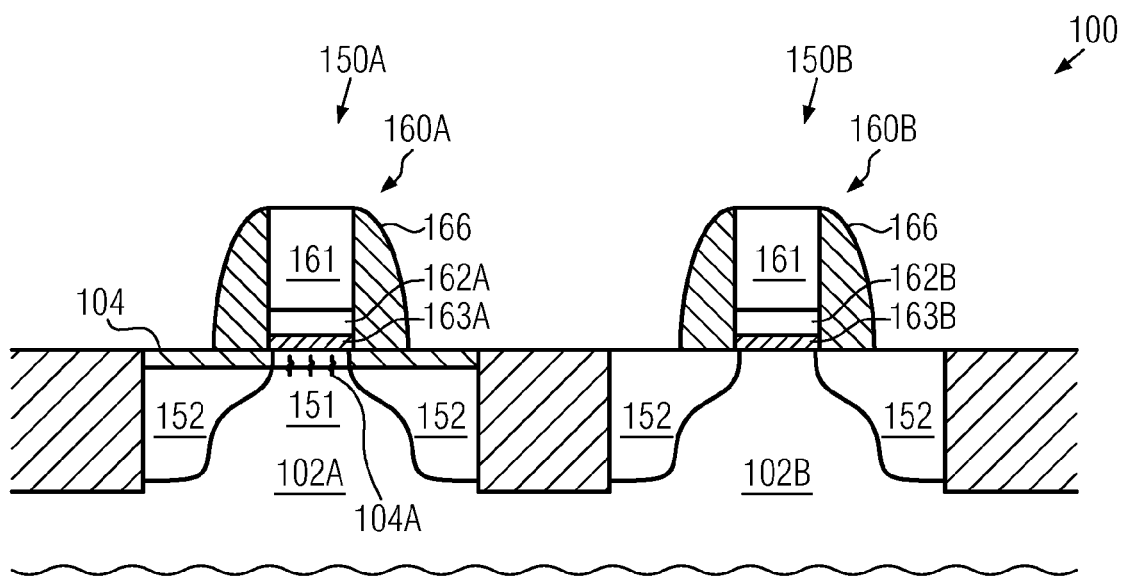
Figure 1D:
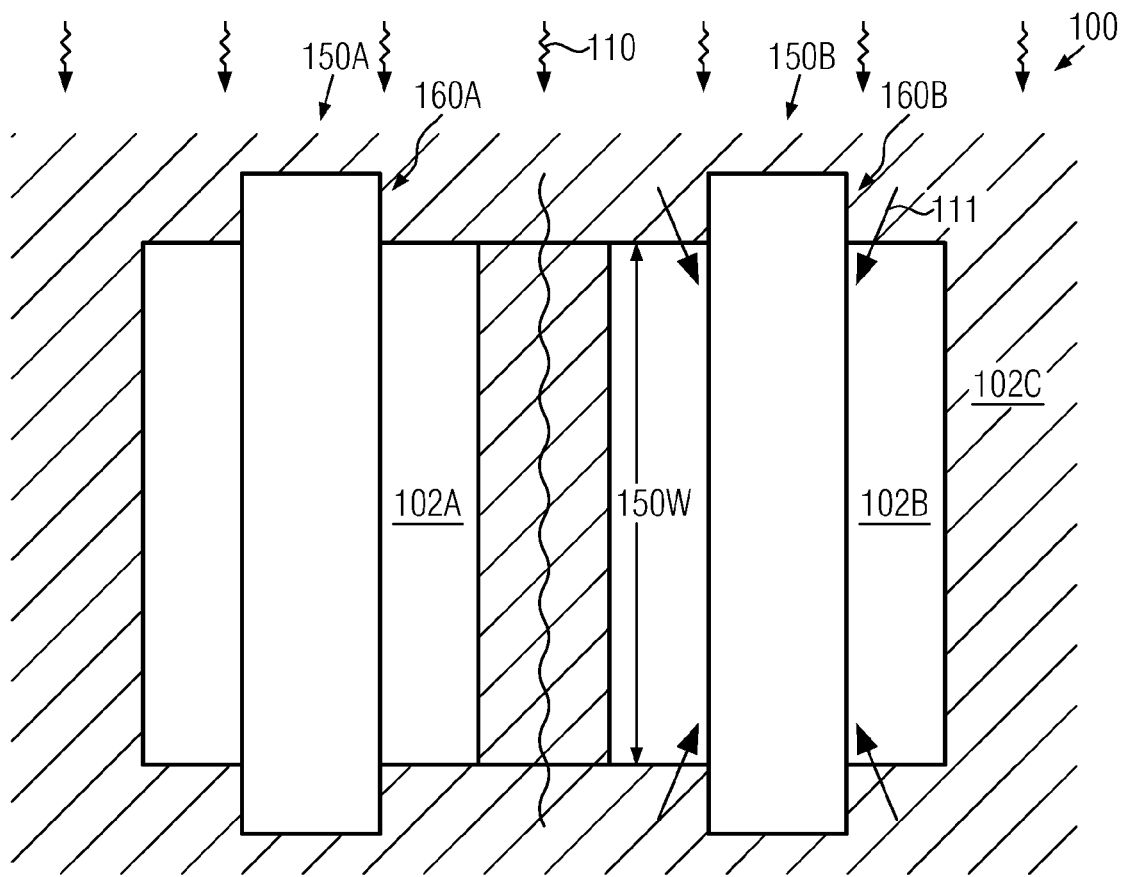
FIG. 1d schematically illustrates a top view of the semiconductor device during a laser-based anneal process, wherein a significant dependency of the resulting threshold voltage from the transistor width may be observed.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which the threshold variability of transistors, such as N-channel transistors, may be significantly reduced in a process strategy for forming sophisticated high-k metal gate electrode structures on the basis of a high-k material that may be provided in an early manufacturing stage. To this end, it has been recognized that surprisingly the incorporation of carbon, at least at and near the surface of the active region, may result in a reduced modification of the electronic characteristics of a sophisticated high-k metal gate electrode structure when performing sophisticated anneal processes, such as laser-based anneal processes. In some illustrative embodiments, the carbon may be positioned within the active region so as to be located at and near the surface, thereby avoiding undue modifications of the transistor characteristics. In this manner, in particular the significant dependency of the threshold voltage of sophisticated N-channel transistors from the transistor width may be significantly reduced, while at the same time allowing using sophisticated laser-based anneal techniques, which may provide superior process strategies in modern manufacturing facilities compared to conventional approaches in which very fast anneal processes may be restricted to flash tools that are operated in a nitrogen environment. Consequently, any such restriction to specific spike anneal tools, as required in conventional process techniques, may result in significant throughput issues, while also typically flash tools may be associated with an increased risk of wafer breakage.

In still other illustrative embodiments, carbon may also be incorporated into P-channel transistors, thereby surprisingly achieving superior performance of these transistors, which is believed to be caused by a reduction of lattice defects in the threshold adjusting semiconductor material. That is, although the reason is still not yet understood, it is assumed that the presence of the carbon species in and in the vicinity of the threshold adjusting semiconductor material, such as the silicon/germanium material in the P-channel transistors, may provide superior quality of the resulting channel region, which in turn may lead to superior transistor performance, for instance to an increased drive current for a given gate leakage current.

In some illustrative embodiments, carbon may be incorporated into the active region of P-channel transistors and N-channel transistors on the basis of a single implantation process, for instance after depositing the threshold adjusting semiconductor material or prior to the deposition thereof, depending on the overall process strategy. A difference in carbon concentration and penetration depth may be established on the basis of any appropriate mask materials, such as the deposition mask that may also be used for forming the threshold adjusting semiconductor material selectively in one type of transistor. In other cases, at least a portion of the carbon species may be incorporated on the basis of the selective epitaxial growth process, thereby providing superior flexibility in separately adjusting depth and concentration of the carbon species in the active regions of the P-channel transistors and N-channel transistors, respectively. In still other illustrative embodiments, at least a portion of the carbon species may be incorporated individually into the active region of different transistors in an earlier manufacturing stage, i.e., upon incorporating the well dopant species, thereby avoiding any additional lithography process while still providing a high degree of flexibility in individually adjusting concentration and depth of the carbon species.

With reference to FIGS. 2a-2h, further illustrative embodiments will now be described in more detail, wherein reference may also be made to FIGS. 1a-1d, if required.

Figure 2A:
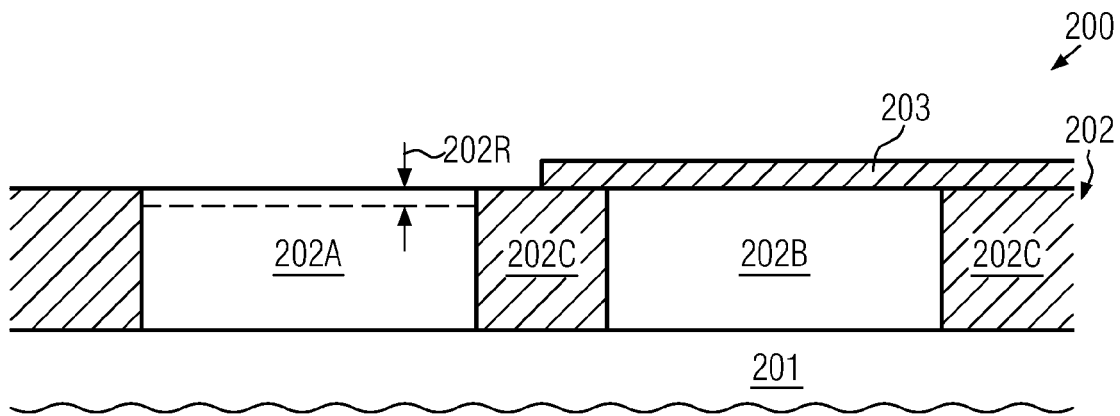
FIGS. 2a-2b schematically illustrate cross-sectional views of a semiconductor device during various manufacturing stages in forming a threshold adjusting semiconductor material in one type of transistor, according to illustrative embodiments.

FIG. 2a schematically illustrates a cross-sectional view of a semiconductor device 200 comprising a substrate 201 and a semiconductor layer 202 formed above the substrate 201. The semiconductor layer 202 may comprise isolation structures 202C that laterally delineate active regions 202A, 202B within the semiconductor layer 202. It should be appreciated that, with respect to these components of the semiconductor device, the same criteria may apply as previously explained with reference to the semiconductor device 100. Furthermore, in the manufacturing stage shown, the active region 202B may have formed thereon a mask 203, for instance in the form of a silicon dioxide material, a silicon nitride material and the like, while the active region 202A is exposed. In the embodiment shown in FIG. 2a, the active regions 202B, 202A may be of different conductivity type, i.e., the basic well doping of these active regions may be based on dopant species creating a different conductivity type. For example, the active region 202B may correspond to the active region of an N-channel transistor to be formed in and above the active region 202B. Hence, the active region 202A may correspond to a P-channel transistor to be formed in and above the active region 202A.

The semiconductor device 200 as illustrated in FIG. 2a may be formed on the basis of any appropriate process strategy. For example, the isolation structures 202C may be formed in accordance with process techniques as are also described above with reference to the semiconductor device 100. Prior to or after forming the isolation structures 202C, any appropriate masking regime and implantation sequence may be performed in order to incorporate a desired well dopant species into the active regions 202A, 202B. Thereafter, the mask 203 may be formed, for instance, by applying appropriate deposition techniques, such as plasma enhanced CVD, thermally activated CVD, oxidation processes and the like. It should be appreciated that forming the mask layer 203 on the basis of an oxidation process may result in a certain degree of material consumption of the active regions 202A, 202B (not shown). After forming an appropriate material for the mask 203, a lithography process may be performed so as to pattern the material into the mask 203, thereby exposing the active region 202A. In some cases, as is also previously discussed, a recess 202R may be formed in the active region 202A in order to take into account the deposition of a threshold adjusting semiconductor material in a later manufacturing stage. In other cases, forming the recess 202R may be omitted. In some illustrative embodiments, the mask 203 may be provided with an appropriate thickness so as to control the incorporation of a carbon species in a later manufacturing stage. That is, as is also discussed above, typically a selective deposition process has to be performed on the basis of the mask 203, which may involve certain cleaning processes and the like, which may cause a certain degree of material removal of the mask 203 prior to actually selectively depositing the threshold adjusting semiconductor material. The corresponding material consumption of the mask 203 may be taken into account by appropriately selecting the initial layer thickness for a given and well-known degree of material erosion during the further processing. In addition to the masking effect during any cleaning processes and the selective deposition process, the mask 203 may also be selected so as to have an appropriate thickness in a later manufacturing stage in order to appropriately control the ion blocking effect during a carbon implantation process. To this end, well-established simulation processes and/or experiments may be performed so as to adjust the ion blocking effect of the mask 203.

In other illustrative embodiments, the thickness of the mask 203 may be selected in accordance with device and process requirements for selectively forming a threshold adjusting semiconductor material in the active region 202A, without requiring any specific adaptation to any subsequent implantation processes.

Figure 2B:
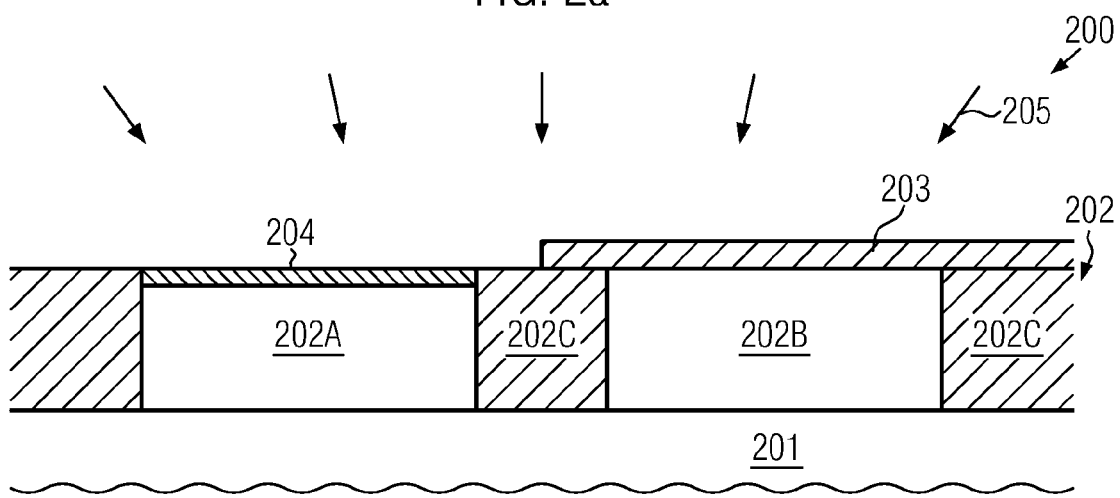

FIG. 2b schematically illustrates the semiconductor device 200 during a selective epitaxial growth process 205, during which a threshold adjusting semiconductor material 204 may be formed on the active region 202A, for instance in and above the recess 202R (FIG. 2a), if provided. It should be appreciated that, upon depositing the semiconductor material 204, this material may represent a part of the active region 202A in order to provide appropriate electronic characteristics for forming thereon a high-k metal gate electrode structure, as is also discussed above. During the selective epitaxial growth process, the mask 203 may efficiently suppress any undue material deposition on the active region 202B. As explained above, the thickness and the material composition of the semiconductor material 204 may have a significant influence on transistor characteristics, such as the threshold voltage, drive current and the like. For example, the threshold adjusting semiconductor material 204 may be provided in the form of a silicon/germanium material having a germanium concentration of up to 25 atomic percent, while a thickness may be in the range of 8-15 nm.

Figure 2C:
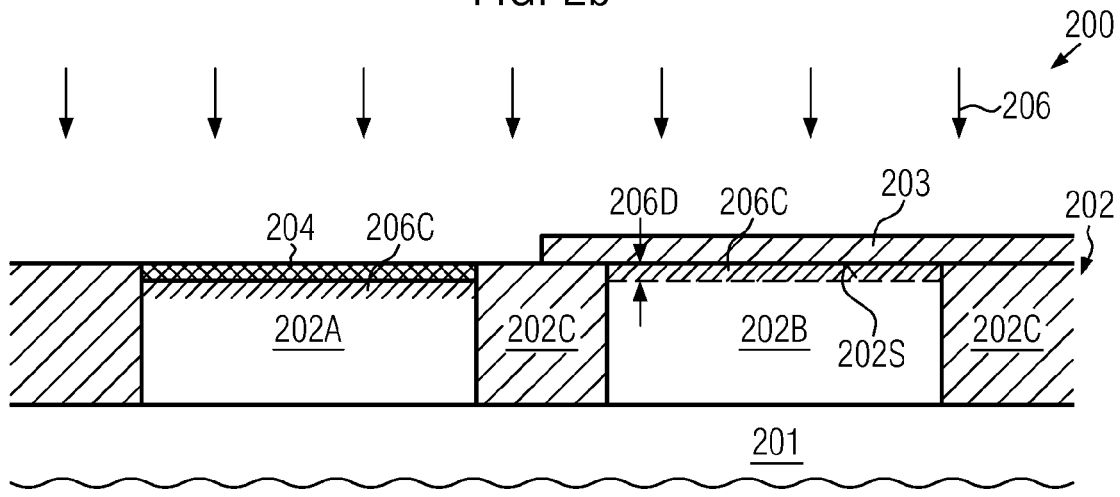
FIG. 2c schematically illustrates the semiconductor device when exposed to an ion implantation process for incorporating a carbon species into at least an N-channel transistor so as to reduce the threshold voltage/transistor width dependency, according to illustrative embodiments, wherein the carbon species may also be incorporated into the threshold adjusting semiconductor material.

FIG. 2c schematically illustrates the semiconductor device 200 in a further advanced manufacturing stage according to illustrative embodiments in which a carbon species 206C may be incorporated into the active regions 202A, 202B. To this end, an ion implantation process 206 may be applied wherein process parameters, such as implantation energy and dose, are appropriately selected in order to position the carbon material 206C at and near the surface 202S of the active region 202B, thereby requiring the implantation of the carbon species 206C through the mask 203. On the other hand, in the embodiment shown in FIG. 2c, the carbon species 206C is incorporated into the active region 202A with an increased penetration depth and may thus be positioned within the threshold adjusting semiconductor material 204 and may also extend into the initial semiconductor material of the active region 202A, depending on the implantation energy used during the process 206. Consequently, due to the presence of the mask 203, the average concentration and penetration depth 206D of the species 206C in the active region 202B may differ from these parameters in the active region 202A. Consequently, a corresponding ratio of these parameters for the species 206C may be adjusted by appropriately selecting the implantation parameters for a given blocking effect of the mask 203. In other words, the resulting dosage and position of the species 206C in the active regions 202A, 202B may be appropriately adjusted by adapting implantation energy and dose and also selecting an appropriate material and thickness for the mask 203. In some illustrative embodiments, a thickness of the mask 203 may be selected to be approximately 10-30 nm for silicon dioxide, silicon nitride and the like. A dose of the ion implantation process 206 may be selected to be approximately $2 \times 10^{14}$-$3 \times 10^{14}$ cm$^{-2}$, while implantation energy may be used in the range of approximately 3-10 keV. Generally, it has been recognized that an increased penetration depth and a higher concentration may be advantageous in the active region 202A in order to enhance overall transistor performance.

After the implantation process 206, the further processing may be continued by forming sophisticated high-k metal gate electrode structures and corresponding transistors, as is also described above with reference to the semiconductor device 100, wherein the incorporated species 206C may provide a reduced dependency of the resulting threshold voltage from the transistor width for a transistor to be formed in and above the active region 202B, while a transistor to be formed in and above the active region 202A may have a significantly improved performance compared to transistors formed on the basis of conventional process strategies in which the incorporation of the carbon species 206C is omitted. It should be appreciated that the superior transistor characteristics may be achieved, even if spike anneal processes such as laser-based processes may be used during the further processing of the semiconductor device 200. Furthermore, it is to be noted that the incorporation of the carbon species 206C, at least in the active region 202B, may be applied at any appropriate manufacturing stage prior to forming the complex high-k metal gate electrode structures.

Figure 2D:
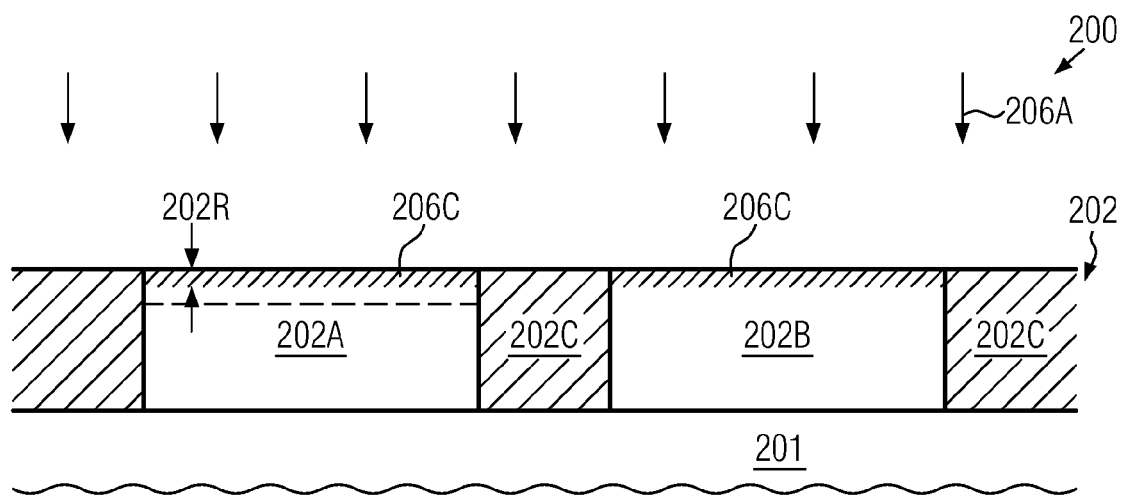
FIGS. 2d-2e schematically illustrate cross-sectional views of the semiconductor device in manufacturing stages in which carbon may be incorporated into the active regions of a P-channel transistor and an N-channel transistor independently without requiring additional process steps, according to further illustrative embodiments.

FIG. 2d schematically illustrates the semiconductor device 200 according to further illustrative embodiments in which the carbon species 206C may be incorporated into the active region 202B and in the active region 202A on the basis of superior flexibility in individually adjusting dosage and penetration depth. In the embodiment shown, an ion implantation process 206A may be performed on the basis of appropriately selected process parameters, that is, dose and implantation energy, in order to incorporate the species 206C into the active region 202B so as to obtain the desired effect. On the other hand, the incorporation of the species 206C into the active region 202A may not comply with requirements for a transistor still to be formed in and above the active region 202A. The required concentration and penetration depth of the species 206C may be adjusted in a subsequent manufacturing stage. Consequently, typically the implantation process 206A may be performed with a reduced process time, while also the implantation energy may be selected so as to obtain the desired average penetration depth in the active region 202B. Thereafter, the further processing may be continued by forming a deposition mask, which may preferably be accomplished by using deposition techniques in order to not unduly "consume" the species 206C in the active region 202B. In other cases, the deposition mask may be formed on the basis of an oxidation process wherein the material consumption may be taken into consideration when performing the implantation process 206A, for instance by appropriately selecting the dose and in particular the implantation energy in order to obtain the desired concentration and penetration depth after the removal of the corresponding deposition mask. Moreover, if desired, upon providing the deposition mask above the active region 202B, a certain degree of recessing, as indicated by 202R, may be formed in the active region 202A, if considered appropriate for the further processing. For example, upon recessing the active region 202A, at least a significant amount of the carbon species 206C may be removed, thereby also removing any possibly damaged areas of the active region 202A caused by the preceding implantation process 206A.

Figure 2E:
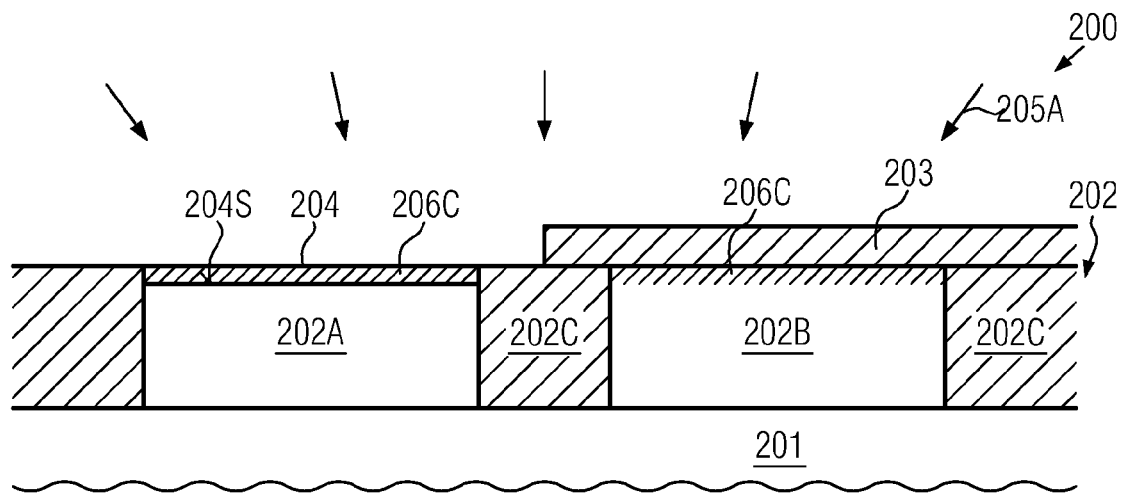

FIG. 2e schematically illustrates the semiconductor device 200 in a further advanced manufacturing stage. As illustrated, the deposition mask 203 may be formed above the active region 202B, which comprises the carbon species 206C. Moreover, the device 200 is exposed to a deposition atmosphere 205A, in which the threshold adjusting semiconductor material 204 may be formed on the active region 202A or within the recess 202R (FIG. 2d), if provided in the preceding manufacturing stage. Moreover, carbon 206C may be added to the deposition atmosphere 205A at any appropriate phase of the deposition process in order to incorporate the species 206C in the active region 202A. Consequently, the species 206C may be formed within the active region 202A, i.e., within the material 204 and at an interface 204S between the initial material of the semiconductor region 202A and the newly formed threshold adjusting material 204. Consequently, by appropriately controlling the process parameters of the deposition process 205A, any desired concentration of the carbon species 206C may be accomplished in the active region 202A without influencing the penetration depth and concentration of the species 206C in the active region 202B. After the deposition process 205A, the further processing may be continued by removing the mask 203 and forming high-k metal gate electrode structures, as is also discussed above.

Figure 2F:
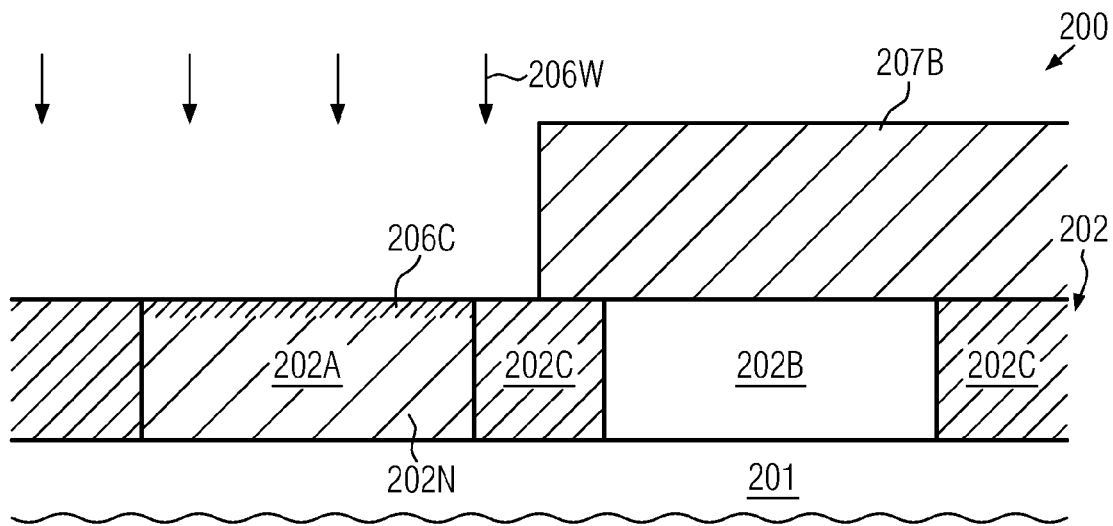
FIGS. 2f-2g schematically illustrate cross-sectional views of the semiconductor device, according to still further illustrative embodiments, in which carbon may be incorporated in P-channel transistors and N-channel transistors separately without requiring additional lithography steps.

FIG. 2f schematically illustrates the semiconductor device 200 according to further illustrative embodiments wherein an individual adjustment of the carbon incorporation may be accomplished during a process sequence for incorporating the well dopant species of the active regions 202A, 202B. As illustrated, an implantation mask 207B, such as a resist mask, may be provided so as to cover one of the active regions 202A, 202B. In the example shown, the active region 202B may be covered so as to expose the active region 202A. On the basis of the implantation mask 207B, any appropriate well dopant species, indicted by 202N, may be incorporated into the active region 202A in accordance with device requirements. Prior to or after a corresponding implantation process, a further implantation process 206W may be performed by using the mask 207B, in which the carbon species 206C may be incorporated into the active region 202A on the basis of appropriately selected process parameters. That is, during the process 206W, implantation dose and energy are selected such that a desired carbon concentration may at least be preserved at an interface formed upon the deposition of a threshold adjusting semiconductor material. In this manner, the carbon 206C may be incorporated so as to extend to a greater depth, if considered appropriate. In other illustrative embodiments, the well dopant species 202N may be incorporated without providing the dopant species 206C in the active region 202A in this manufacturing stage.

Figure 2G:
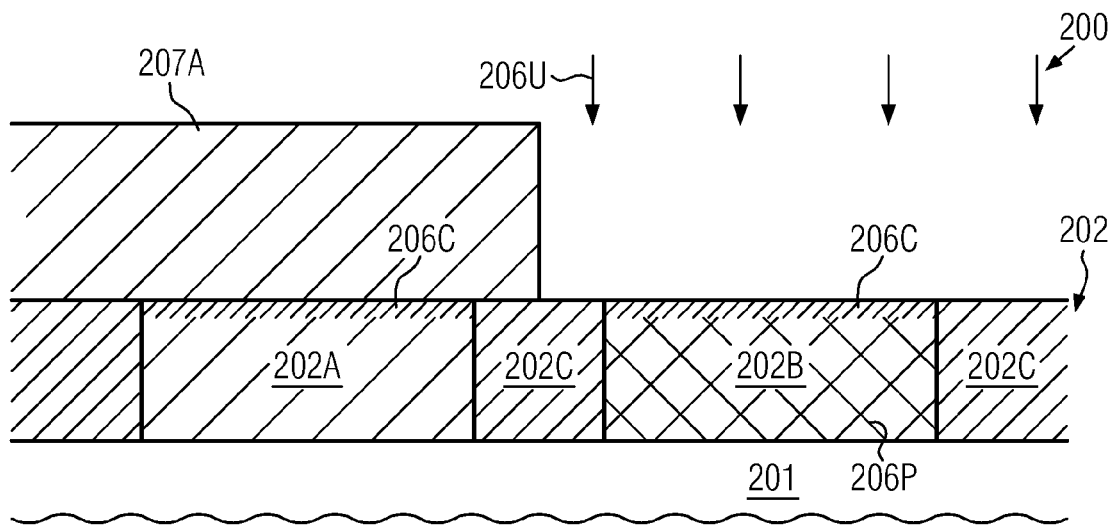

FIG. 2g schematically illustrates the semiconductor device 200 in a further advanced manufacturing stage in which a further implantation mask 207A may cover the active region 202A while exposing the active region 202B. As described above, the active region 202A may have incorporated therein the carbon species 206C. On the basis of the implantation mask 207A, a well dopant species 202P may be incorporated into the active region 202B, while prior to or after the incorporation of the species 202P, a further implantation process 206U may be performed in order to incorporate the carbon 206C into the active region 202B by using specifically selected process parameters. Consequently, at least in the active region 202B, the carbon material 206C may be provided with a desired concentration and penetration depth in order to obtain the desired threshold voltage stabilizing effect while also taking into consideration any further processes, such as the formation of a deposition mask, such as the mask 203 (FIG. 2a), which may consume material of the active region 202B if formed on the basis of an oxidation process. Thereafter, the processing may be continued by removing the implantation mask 207A and performing any heat treatments, if required. Thereafter, the threshold adjusting semiconductor material may be selectively formed in the active region 202A on the basis of any appropriate process strategy, as also discussed above. For example, a recess may be formed in the active region 202A, which may result in a certain removal of the carbon species 206C, if provided in this manufacturing stage. Moreover, upon depositing the threshold adjusting semiconductor material, also a carbon species may be incorporated, as previously explained with reference to FIG. 2e, thereby establishing a desired concentration of the carbon material within the active region 202A. If the carbon material 206C is also incorporated in the active region 202A, for instance on the basis of the implantation process 206W of FIG. 2f, the depth of the material 206C may be adjusted without being restricted to the selective deposition process during which a further carbon species may be incorporated.

Consequently, superior flexibility in individually adjusting the carbon concentration and depth for the active regions 202A, 202B may be accomplished without requiring an additional lithography process.

Figure 2H:
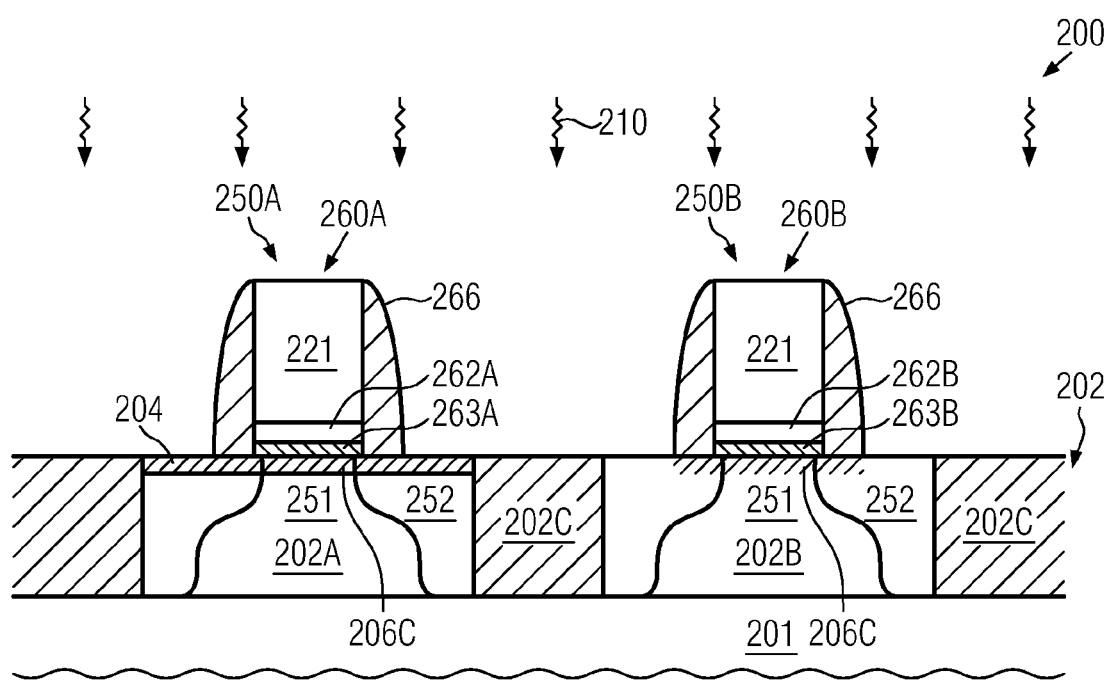
FIG. 2h schematically illustrates a cross-sectional view of the transistor device in a further advanced manufacturing stage when a spike anneal process, such as a laser-based anneal process, may be applied, according to still further illustrative embodiments.

FIG. 2h schematically illustrates the semiconductor device 200 in a further advanced manufacturing stage. As illustrated, a transistor 250A may be formed in and above the active region 202A, which may comprise the threshold adjusting semiconductor material 204. The transistor 250A may comprise a gate electrode structure 260A, which may comprise a gate insulation layer 263A having incorporated therein a high-k dielectric material, possibly in combination with a conventional dielectric material, as is also previously explained with reference to the semiconductor device 100. The gate electrode structure 260A may further comprise a metal-containing electrode material 262A, wherein, in one or both of the layers 263A, 262A, an appropriate work function adjusting metal species may be incorporated, as is also discussed above. Furthermore, an additional electrode material 221, such as a silicon material and the like, may be provided in the gate electrode structure 260A, which may also comprise a spacer structure 266. Similarly, a transistor 250B may be formed in and above the active region 202B and may comprise a gate electrode structure 260B in the form of a high-k metal gate electrode structure. That is, a gate insulation layer 263B may comprise a high-k dielectric material, followed by a metal-containing electrode material 262B in combination with the electrode material 221. Furthermore, the spacer structure 266 may also be provided in the gate electrode structure 260B. As discussed above, one or both of the material layers or layer systems 263B, 262B may comprise an appropriate work function adjusting species. Furthermore, the transistors 250A, 250B may comprise drain and source dopant species in order to form drain and source regions 252, which may laterally enclose a corresponding channel region 251. The channel region 251 may be formed below the gate electrode structures 260A, 260B, respectively, and may be in contact therewith, that is, at least the gate insulation layers 263A, 263B may connect to the corresponding channel regions 251. Moreover, in the embodiment shown, the carbon species 206C may be incorporated in the channel region 251 of the transistor 250A, at least within the threshold adjusting material 204, wherein the actual depth and concentration may have been adjusted in accordance with any of the previously described process techniques. Similarly, the carbon species 206C may be incorporated in at least the channel region 251 of the transistor 250B and may have any appropriate concentration and penetration depth so as to provide superior stability of the threshold voltage of the transistor 250B. In some illustrative embodiments, the concentration and/or the depth of the carbon species 206C in the channel regions 251 may be different in the active regions 202A, 202B, in order to appropriately adjust the corresponding transistor characteristics. For example, in the transistor 250A, an increased concentration and/or penetration depth of the carbon material 206C may be implemented, thereby providing superior transistor characteristics, for instance by reducing the number of crystal defects within the channel region 251. On the other hand, the carbon material 206C in the active region 202B may be provided with a reduced concentration and penetration depth so as to not unduly affect the overall transistor characteristics except for the superior stability of the threshold voltage with respect to the transistor width.

The transistors 250A, 250B may be formed on the basis of any appropriate process strategy, for instance by forming the gate electrode structures 260A, 260B using sophisticated process techniques, as is also described above with reference to the semiconductor device 100. Furthermore, the drain and source dopant species for the regions 252 may be incorporated by using the spacer structure 266 and an appropriate masking regime. At any appropriate stage, at least one spike anneal process 210 may be performed in order to enhance activation of the dopant species in the drain and source regions 252, for instance without inducing a pronounced dopant diffusion, if a corresponding "blurring" of the dopant profile is considered inappropriate. In one illustrative embodiment, the spike anneal process 210 may be performed as a laser-based anneal process in which a laser beam may be appropriately scanned across the device 200 in order to create appropriate thermal conditions for activating the dopant species in the drain and source regions 252. Although the actual mechanisms are still not yet fully understood, the presence of a carbon species 206C in the active region 202B may provide superior stability of the electronic characteristics of the gate electrode structure 260B, thereby significantly reducing dependency of the resulting threshold voltage of the transistor 250B relative to the width of the transistor 250B. That is, transistors of different widths may exhibit a less pronounced correlation between transistor width and the resulting threshold voltage, thereby providing superior overall device uniformity. For example, in particular the pronounced increase in threshold voltage in transistors of short transistors widths may be significantly reduced for N-channel transistors having incorporated therein the carbon species 206C, wherein generally a reduced threshold voltage may be achieved. On the other hand, the measurement of P-channel transistors, such as the transistor 250A, for instance determining the universal transistor curve, indicates a significant improvement of, for instance, up to ten percent or higher in transistors having incorporated therein the carbon species 206C compared to conventional P-channel transistors having otherwise the same transistor configuration.

As a result, the present disclosure provides semiconductor devices and manufacturing techniques in which a pronounced dependency of the threshold voltage of, for instance, N-channel transistors from the transistor width upon forming sophisticated high-k metal gate electrode structures and applying laser-based anneal techniques may be reduced by incorporating a carbon species at least at and near the surface of the active region. It has also been recognized that a significant improvement of the performance of P-channel transistors may be achieved by also incorporating a carbon species, wherein it is believed that a reduction of the lattice defects in the context of a threshold adjusting semiconductor material may result in the corresponding gain in performance. The carbon species may be incorporated on the basis of an implantation process without requiring additional lithography steps, thereby avoiding additional process complexity. In one illustrative embodiment, the carbon species may be incorporated after the selective deposition of the threshold adjusting semiconductor material and prior to the removal of the deposition mask, thereby achieving a very efficient process flow and enabling an efficient adjustment of different carbon concentrations and/or penetration depth for N-channel transistors and P-channel transistors, respectively.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a threshold adjusting semiconductor material on a semiconductor material of a first active region of a P-channel transistor, while masking the semiconductor material of a second active region of an N-channel transistor with a masking layer having an opening that exposes the first active region;
   with said masking layer in position above said second active region, performing an ion implantation process to implant a carbon species through the opening in the masking layer into said first active region and to implant the carbon species through the masking layer and into said second active region;
   forming a first gate electrode structure on said threshold adjusting semiconductor material of said first active region and a second gate electrode structure on said second active region, each of said first and second gate electrode structures comprising a gate insulation layer comprising a high-k dielectric material; and
   forming first drain and source regions of said P-channel transistor in said first active region and second drain and source regions of said N-channel transistor in said second active region.

2. The method of claim 1, wherein forming said first and second drain and source regions comprises performing a laser-based spike anneal process.

3. The method of claim 1, further comprising recessing said first active region prior to forming said threshold adjusting semiconductor material.

4. The method of claim 3, wherein performing said ion implantation process comprises incorporating said carbon species into the semiconductor material of said first active region prior to recessing said first active region, and forming said threshold adjusting semiconductor material in said recess.

5. The method of claim 1, wherein said threshold adjusting semiconductor material comprises silicon and germanium.

6. A method of forming a semiconductor device, the method comprising:
   forming a masking layer that has an opening that exposes a first active region of a P-channel transistor and masks a second active region of an N-channel transistor;
   with said masking layer in position above said second active region, performing an ion implantation process so as to implant carbon ions through the opening in the masking layer and into a semiconductor material of the first active region and to implant carbon ions through the masking layer and into at least a surface of a semiconductor material in the second active region of the N-channel transistor;
   forming a first gate electrode structure on said semiconductor material of said first active region and a second gate electrode structure on said second active region, said first and second gate electrode structures comprising a gate insulation layer comprising a high-k dielectric material;
   incorporating drain and source dopant species into said first and second active regions; and performing at least one laser-based anneal process.

7. A method, comprising:
   forming a threshold adjusting semiconductor material on a semiconductor material of a first active region of a P-channel transistor, while masking a semiconductor material of a second active region of an N-channel transistor with a masking layer;
   with said masking layer in position above said N-channel active region, performing an ion implantation process to implant a carbon species at least into a surface of the semiconductor material of said first and second active regions, wherein a concentration and penetration depth of said carbon species in the semiconductor material of said first active region differs from a concentration and penetration depth of said carbon species in the semiconductor material of said second active region;
   forming a first gate electrode structure on said threshold adjusting semiconductor material of said first active region and a second gate electrode structure on said second active region, each of said first and second gate electrode structures comprising a gate insulation layer comprising a high-k dielectric material; and
   forming first drain and source regions of said P-channel transistor in said first active region and second drain and source regions of said N-channel transistor in said second active region.

8. The method of claim 7, further comprising recessing said first active region prior to forming said threshold adjusting semiconductor material.

9. The method of claim 7, wherein said an ion implantation process is performed so as to implant said carbon species into a non-recessed surface of said first active region.

* * * * *